US010423078B1

(12) United States Patent
Shen et al.

(10) Patent No.: US 10,423,078 B1
(45) Date of Patent: Sep. 24, 2019

(54) FINFET CUT ISOLATION OPENING REVISION TO COMPENSATE FOR OVERLAY INACCURACY

(71) Applicant: GLOBALFOUNDRIES INC., Grand Cayman (KY)

(72) Inventors: Hongliang Shen, Ballston Lake, NY (US); Erfeng Ding, Dresden (DE); Guoxiang Ning, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/398,841

(22) Filed: Apr. 30, 2019

Related U.S. Application Data

(62) Division of application No. 16/159,877, filed on Oct. 15, 2018, now Pat. No. 10,324,381.

(51) Int. Cl.
| | |
|---|---|
| *G01B 11/00* | (2006.01) |
| *G03F 7/20* | (2006.01) |
| *H01L 27/088* | (2006.01) |
| *H01L 21/768* | (2006.01) |
| *G06F 17/50* | (2006.01) |

(52) U.S. Cl.
CPC ...... *G03F 7/70633* (2013.01); *G06F 17/5072* (2013.01); *H01L 21/76816* (2013.01); *H01L 27/0886* (2013.01)

(58) Field of Classification Search
CPC ...... G03F 7/70633; G03F 9/70; G03F 9/7076; G03F 9/7088; G03F 9/7049

USPC ....................................................... 356/401
See application file for complete search history.

(56) References Cited

U.S. PATENT DOCUMENTS

| | | | |
|---|---|---|---|
| 9,293,377 | B2 | 3/2016 | Zhong et al. |
| 9,672,311 | B2 | 6/2017 | Hamouda |
| 9,904,753 | B2 | 2/2018 | Kim et al. |
| 2018/0337177 | A1 | 11/2018 | Chang et al. |

FOREIGN PATENT DOCUMENTS

KR 20160116285 A 10/2016

OTHER PUBLICATIONS

U.S. Appl. No. 16/159,877, Notice of Allowance dated Apr. 24, 2019, 14 pages.

*Primary Examiner* — Md M Rahman
(74) *Attorney, Agent, or Firm* — Anthony Canale; Hoffman Warnick LLC

(57) ABSTRACT

A method to address overlay accuracy compensation using finFET cut isolation revisions is disclosed. For an integrated circuit (IC) layout including at least a portion of an active region including a plurality of gates extending over a plurality of fins, prior to optical proximity correction of the IC layout: the method determines a number of fins to be cut with same source/drain connection by a fin cut isolation opening, and determines a fin cut isolation pitch in the gate length direction of the plurality of gates. The method revises a size of a fin cut isolation opening in the IC layout based on a number of fins to be cut with same source/drain connection by the fin cut isolation opening and the fin cut isolation pitch in the gate length direction. The revision in size of the fin cut isolation compensates for overlay inaccuracy.

11 Claims, 6 Drawing Sheets

FINFET CUT ISOLATION OPENING REVISION TO COMPENSATE FOR OVERLAY INACCURACY

CROSS-REFERENCE TO RELATED APPLICATIONS

This application is a divisional of U.S. application Ser. No. 16/159,877, filed on Oct. 15, 2018, currently pending and hereby incorporated by reference in its entirety.

BACKGROUND

The present disclosure relates to reticle overlay accuracy, and more specifically, to a method of revising fin-type field effect transistor (finFET) fin cut isolation openings to compensate for overlay inaccuracy.

Advanced manufacturing of ICs requires formation of individual circuit elements, e.g., transistors such as field-effect-transistors (FETs) and the like, based on specific circuit designs. A FET generally includes source, drain, and gate regions. The gate region is placed between the source and drain regions and controls the current through a channel region (often shaped as a semiconductor fin) between the source and drain regions. Gates may be composed of various metals and often include a work function metal which is chosen to create desired characteristics of the FET. Transistors may be formed over a substrate and may be electrically isolated with an insulating dielectric layer, e.g., inter-level dielectric (ILD) layer. Contacts may be formed to each of the source, drain, and gate regions through the dielectric layer in order to provide electrical connection between the transistors and other circuit elements that may be formed subsequent to the transistor in other metal levels.

Fin-type field effect transistors ("FinFETs") have become increasingly widespread because FinFETs offer better electrostatic control over the behavior in the channel than planar FETs. FinFETs are formed by creating a number of semiconductor fins on a substrate and placing a gate conductor perpendicularly across the fins. A FinFET is created by the gate forming a channel region below the gate in the fin, and source/drain regions formed in the fin aside the gate. Contacts are formed vertically to connect to each of the gate, drain and source.

In the microelectronics industry as well as in other industries involving construction of microscopic structures (e.g., micromachines, magnetoresistive heads, etc.) there is a continued desire to reduce the size of structural features and microelectronic devices and/or to provide a greater amount of circuitry for a given chip size. Miniaturization in general allows for increased performance (more processing per clock cycle and less heat generated) at lower power levels and lower cost. Present technology is at atomic level scaling of certain micro-devices such as logic gates, FETs and capacitors, for example. Circuit chips with hundreds of millions of such devices are common.

Photolithography is a technique for transferring an image rendered on one media onto another media photographically. Photolithography techniques are widely used in semiconductor fabrication. Typically, a circuit pattern is rendered as a positive or negative mask image which is then projected onto a silicon substrate coated with photosensitive materials (e.g., PR). Reticles are used to control radiation impingement on the masked surface to chemically change those areas of the coating exposed to the radiation, usually by polymerizing the exposed coating. The un-polymerized areas are removed, being more soluble in the developer than the polymerized regions, and the desired image pattern remains.

One challenge with advanced FinFET technology is ensuring proper alignment of parts during photolithography as the manufacturing process progresses. A photolithography reticle scanner identifies overlay marks on a layer of the wafer and precisely positions the reticle for the next layer relative to the wafer, e.g., to be used to pattern a mask used to form the layer. In some cases, parts of the circuit do not align as manufacturing progresses, creating an overlay shift, i.e., a misalignment.

SUMMARY

A first aspect of the disclosure is directed to a method, comprising: for an integrated circuit (IC) layout including at least a portion of an active region including a plurality of gates extending over a plurality of fins, prior to optical proximity correction of the IC layout: determining a number of fins to be cut with same source/drain connection by a fin cut isolation opening; determining a fin cut isolation pitch in a gate length direction of the plurality of gates; and revising a size of the fin cut isolation opening in the IC layout based on a number of fins to be cut with same source/drain connection by the fin cut isolation opening and the fin cut isolation pitch in the gate length direction.

A second aspect of the disclosure relates to a method, comprising: for an integrated circuit (IC) layout including at least a portion of an active region including a plurality of gates extending over a plurality of fins, prior to optical proximity correction of the IC layout: determining a number of fins to be cut with same source/drain connection by a fin cut isolation opening; determining a fin cut isolation pitch in a gate length direction of the plurality of gates; and for each selected side of the fin cut isolation opening in a respected fin: in response to the number of fins to be cut with same source/drain connection by the fin cut isolation opening being two and the fin cut isolation pitch in the gate length direction greater than two gate pitch, moving the selected side of the fin cut isolation opening in the IC layout to reduce a width of the fin cut isolation opening by up to 0.5 nanometers; in response to the number of fins to be cut with same source/drain connection by the fin cut isolation opening being two and the fin cut isolation pitch in the gate length direction being less than or equal to two gate pitch, moving the selected side of the fin cut isolation opening in the IC layout to reduce a width of the fin cut isolation opening by up to 1.0 nanometers; in response to the number of fins to be cut with same source/drain connection by the fin cut isolation opening being one and the fin cut isolation pitch in the gate length direction being greater than two gate pitch, moving the selected side of the fin cut isolation opening in the IC layout to reduce a width of the fin cut isolation opening by up to 1 nanometers; or in response to the number of fins to be cut with same source/drain connection by the fin cut isolation opening being one and the fin cut isolation pitch in the gate length direction being less than or equal to two gate pitch, moving the selected side of the fin cut isolation opening in the IC layout to reduce a width of the fin cut isolation opening by up to 1.5 nanometers.

A third aspect of the disclosure is directed to an integrated circuit (IC) structure, comprising: a plurality of semiconductor fins on a substrate; a first fin-type field effect transistor (finFETs) using at least one of the semiconductor fins; a second fin-type field effect transistor (finFETs) on the substrate and adjacent the first finFET, the second finFET using more semiconductor fins than the first finFET but sharing at least one semiconductor fin with the first finFET; a first fin cut isolation segregating the at least one shared semiconductor fin between the first and second finFET, the first fin cut isolation having a first width; and a second fin cut isolation segregating the at least one shared semiconductor fin of the first finFET from at least one third finFET, the second fin cut isolation having a second width, wherein the first and second width are within 1.5 nanometers of one another.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

Figure 1:
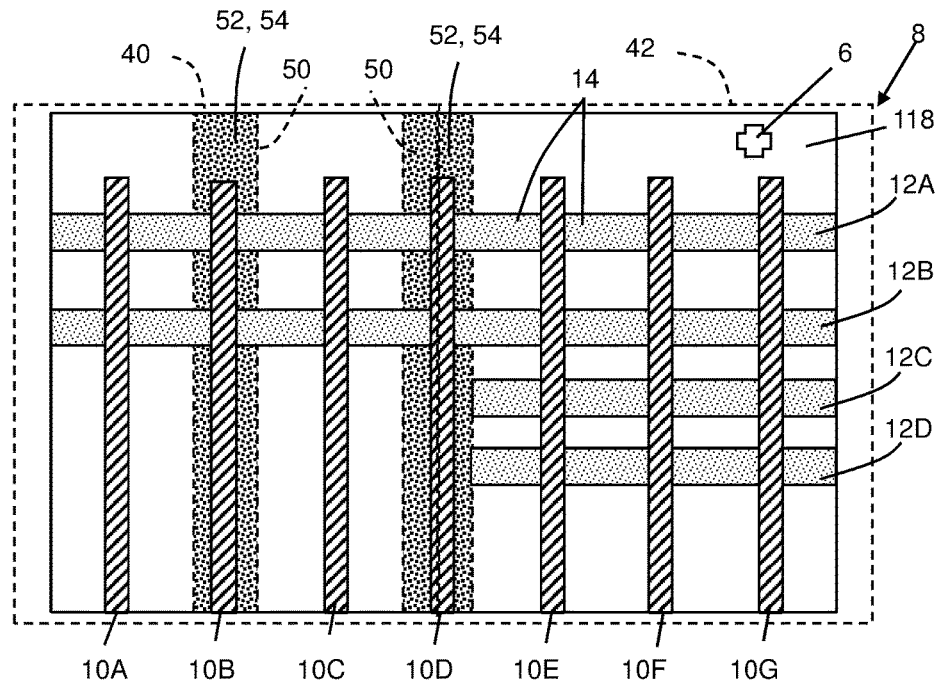
FIG. 1 shows a schematic plan view in plane X-Y of a prior art integrated circuit (IC) layout.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

Embodiments of the disclosure provide a method to address overlay accuracy compensation using finFET cut isolation opening revisions in an integrated circuit (IC) layout. For an IC layout including at least a portion of an active region including a plurality of gates extending over a plurality of fins, prior to optical proximity correction of the IC layout: the method determines a number of fins to be cut with same source/drain connection by a fin cut isolation opening in the fin cut isolation region, and determines a fin cut isolation pitch in a gate length direction. The method revises a size of a fin cut isolation opening in the image in the IC layout based on a number of fins to be cut with same source/drain connection by the fin cut isolation opening and the fin cut isolation pitch in the gate length direction. The revision in size of the fin cut isolation compensates for overlay inaccuracy.

Figure 2:
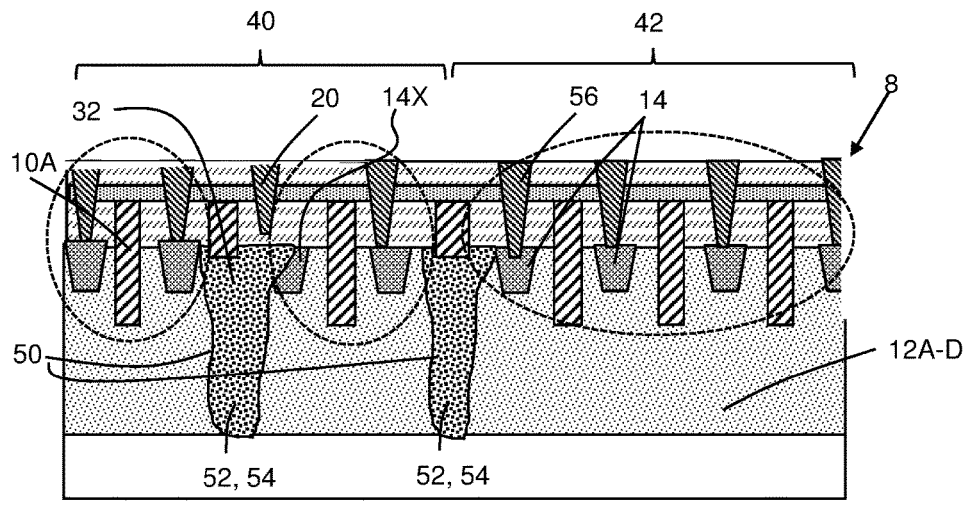
FIG. 2 shows a cross-sectional view of a prior art IC structure formed using the IC layout of FIG. 1.

FIG. 1 shows a schematic plan view of overlying layers of a conventional integrated circuit (IC) structure 8 (e.g., including reticle layouts for the layers), and FIG. 2 shows a cross-sectional view of IC structure 8 formed according to conventional processes. As shown in FIG. 1, a number of transistors (in dashed circles/ovals in FIG. 2) are formed by a gate 10 (10A-G shown, 10A, C and E-G are active) extending over one or more semiconductor fins 12A-D (2 or 4 used), creating a channel thereunder, and source/drain (S/D) regions 14 (not all labeled) in an upper surface of the fins adjacent a respective gate. As shown in FIG. 2, a trench silicide (TS) contact 20 through various dielectric layers (not labeled) to a S/D region 14X can be shifted or offset (to left as shown), creating un-landed TS contact 20. That is, TS contact 20 does not land on or contact S/D region 14X, creating an open circuit failure. As a result, the transistor (middle) to which S/D region 14X belongs is not symmetrical. The overlay shift can be caused by low overlay margins in a number of relative layers, e.g., such as reticle overlays for a fin-cut (RC) layer over a semiconductor (FN) layer, a gate (PC) layer over a fin-cut (RC) layer, and/or a trench block (TB) mask over a gate (PC) layer.

Figure 3:
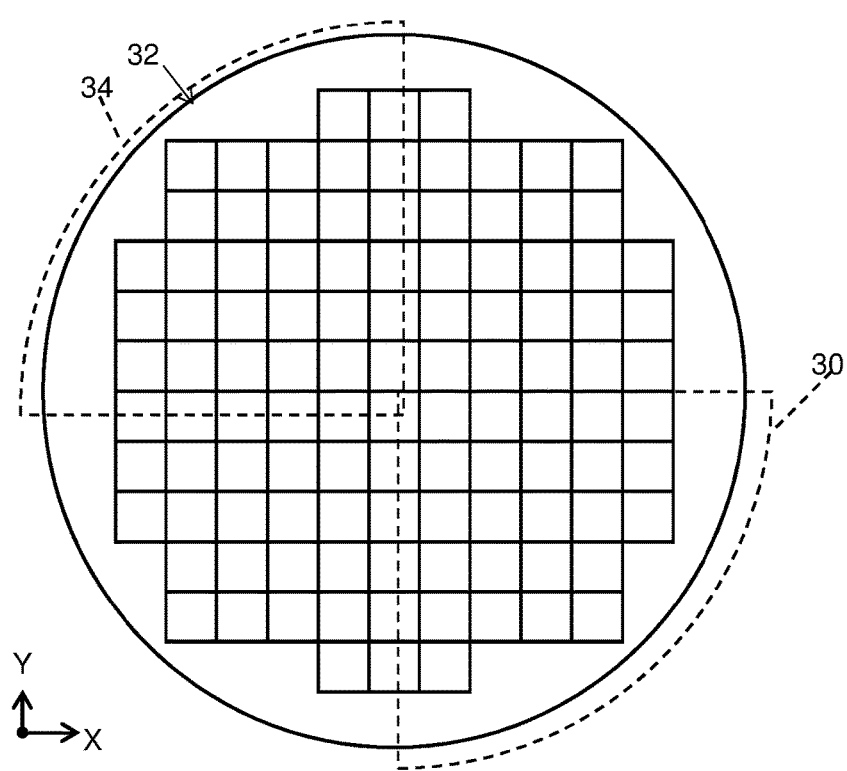
FIG. 3 shows a plan view of different regions of an IC wafer.

To address such issues, conventionally photolithography reticle scanners employ a shift correction, referred to as a correction per exposure (CPE). A challenge with making corrections is that a particular overlay shift issue can occur in one portion of the semiconductor wafer, while other portions require more or less shift. In this case, current reticle scanners may not recognize the extent of inaccuracy in the raw measurement data of overlay offset in certain areas, and may over or under compensate any correction provided. For example, as shown in FIG. 3, a CPE may be formulated for a particular quadrant 30 of an IC wafer 32 (e.g., a lower right corner), and then applied to another quadrant 34 (e.g., an upper left quadrant) where the same CPE over compensates for the offset/shift occurring in that quadrant. This issue can be observed with image based overlay (IBO) reticle scanners and the more accurate, but less widely used, electron based overlay (EBO) reticle scanners.

Returning to FIGS. 1 and 2, another challenge is addressing alignment in complex active regions such as those that use different sized features on a wafer. For example, an area 40 using, for example, 16 nanometer (nm) wide gates may be next to an area 42 using, for example, 14 nm gates. In one example, a fin cut isolation opening(s) (RC) 50 may be made in fins 12A-D to separate parts of the fin to create different transistors in the same fin, e.g., in dashed circles in FIG. 2. The fin cut isolation opening(s) 50 can be made using any now known photolithography technique, e.g., depositing a photoresist, aligning a reticle, patterning a mask in the photoresist, and etching to form the fin cut isolation opening. As understood, a fin cut isolation opening 50 is filled with dielectric 52 to create a fin cut isolation 54, also known as a diffusion break. An etching for a fin cut isolation opening 50 near different sized active areas 40, 42 on an IC wafer can make the surface not flat, e.g., the 16 nm area 40 surface may be lower (see upper left surface in FIG. 2). Consequently, the reticle for the next layer may be higher (farther way) over the 16 nm area 40, which can result in the later used gate formation (PC) and/or trench block (TB) reticles mis-aligning. The mis-alignment contributes further to cause, for example, unlanding trench silicide contact 20 (to S/D) issues. This issue may be more profound in 16 nm area 40 where TS contact 20 may be shorter, and has a smaller etching margin compared to contacts 56 in 14 nm area 42 where TS contact 56 is larger and can be etched for a longer period to ensure landing on S/D region 14. The complex fin cutting arrangements that can occur in differently sized active regions 40, 42 can also result in unexpected optical proximity correction (OPC) retargeting and/or dissection, which can cause further inconsistent etching within S/D and contact connections.

Figure 4:
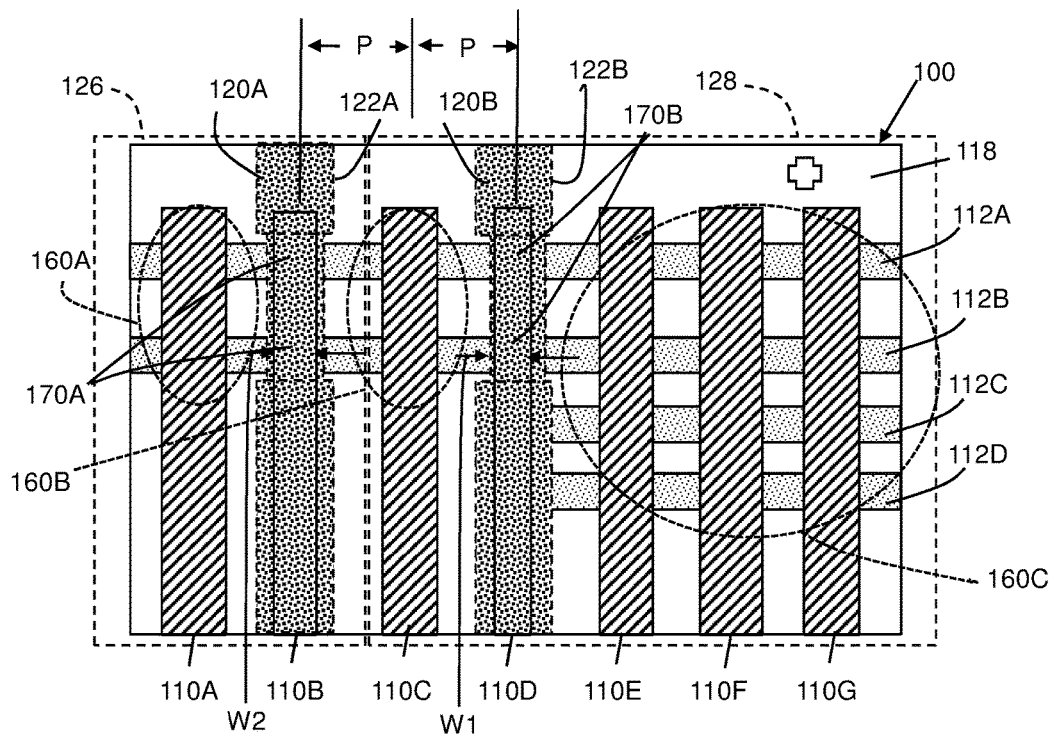
FIG. 4 shows a schematic plan view of an IC layout revised according to embodiments of the disclosure.
Figure 5:
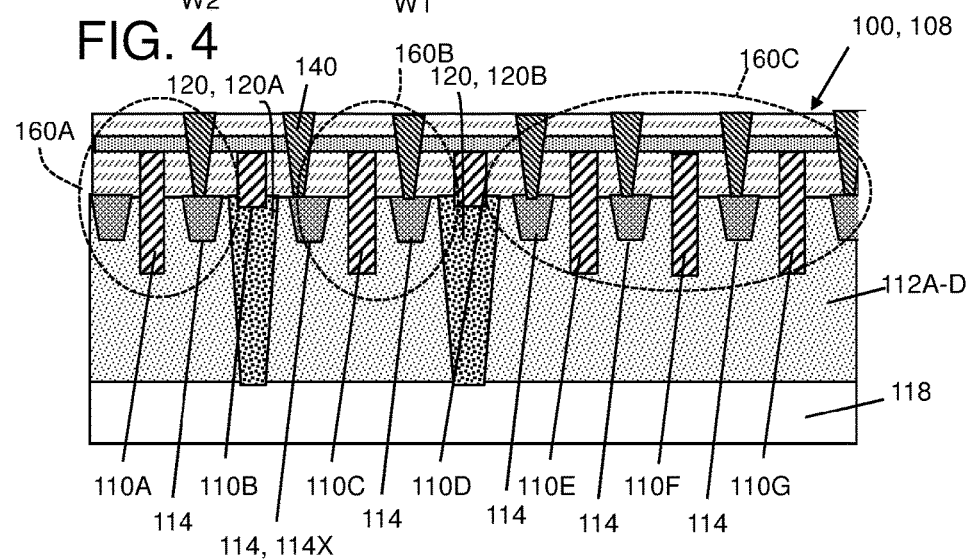
FIG. 5 shows a cross-sectional view of the IC structure formed using the IC layout of FIG. 4.

FIGS. 4 and 5 show an illustrative setting in which teachings of the disclosure are applicable. FIG. 4 shows a schematic plan view of overlying layers of an integrated circuit (IC) structure 100 (e.g., including reticle layouts for the layers), and FIG. 5 shows a cross-sectional view of an IC structure 108 eventually formed according to embodiments of the disclosure. As shown FIGS. 4 and 5, a number of transistors 160A-C (in dashed circles/ovals) may eventually be formed by a gate 110 (e.g., seven, 110A-G) extending over one or more semiconductor fins 112 (e.g., four, 112A-D). (In FIG. 4, gates 110B, 110D are shown as transparent to illustrate revisions to fin cut isolations 120A, 120B, and to indicate they are inactive dummy gates). In the examples shown, the transistors may each use two or more fins 112, but this is not necessary. As understood, each gate 110 creates a channel thereunder in fin(s) 112, and source/drain (S/D) regions 114 (FIG. 5) are formed in an upper surface of the fins adjacent a respective gate. As will be described, fin cut isolation openings 122 for fin cut isolations 120 (e.g., two: 120A, 120B), also known as diffusion breaks, are revised to compensate for overlay inaccuracy. Although shown as the same width, IC layout 100 may include regions having different width gates. For example, region 126 may have a first gate 110A having a width, e.g., 16 nm, that is less than a width, e.g., 14 nm, of another gate 110D in another region 128. FIG. 5 shows a trench silicide (TS) contact 140 according to embodiments of the disclosure that while shifted due to overlay inaccuracy, still lands on S/D region 114X because of the revisions made to fin cut isolation openings 122, and in particular, opening 122A.

Figure 6:
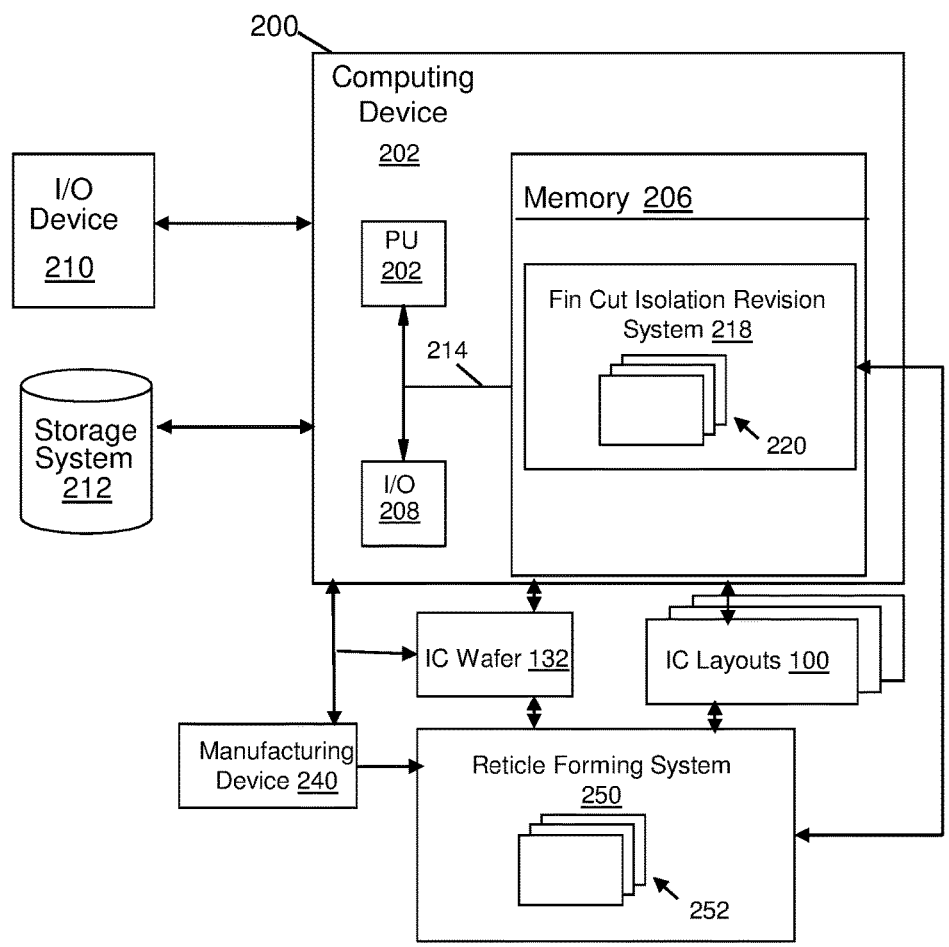
FIG. 6 shows a schematic view of an illustrative environment for implementing methods according to embodiments of the disclosure.

Turning to FIG. 6, process methodologies according to the disclosure may be implemented using an environment 200 having one or more computing devices 202. Computing device 202 and example components thereof may be implemented in various systems and methods according to embodiments of the present disclosure. As discussed herein, computing device 202 can be in communication with IC layout 100 and/or IC wafers 132 according to embodiments. To this extent, computing device 202 can perform various processes to determine a number of fins in a region, determine a fin cut isolation pitch in a gate length direction and revise fin cut isolation opening size, as will be described herein. Although one IC wafer 132 is shown for the sake of example, it is understood that environment 200 may be configured to operate on and/or interact with multiple IC wafers 132, sequentially and/or simultaneously.

Environment 200 is shown to include computing device 202 including a processing unit (PU) 204 (e.g., one or more processors), a memory 206 (e.g., a storage hierarchy), an input/output (I/O) component 208, an I/O device 210 (e.g., one or more I/O interfaces and/or devices), a storage system 212 and a communications pathway 214. In general, PU 204 executes program code, such as a fin cut isolation revision system 218 at least partially fixed in memory 206. While executing program code, PU 204 can process data, which can result in reading and/or writing transformed data from/to memory 206 and/or I/O device 208 for further processing. Pathway 214 provides a communications link between each of the components in computing device 202. I/O component 208 can comprise one or more human I/O devices, which enable a human or system user to interact with computing device 202 and/or one or more communications devices to enable user(s) to communicate with computing device 202 using any type of communications link. To this extent, fin cut isolation revision system 218 can manage a set of interfaces (e.g., graphical user interface(s), application program interface, etc.) that enable user(s) to interact with system 218. Fin cut isolation revision system 218 may include a group of modules 220 to perform various functions as discussed herein. Further, fin cut isolation revision system 218 can manage (e.g., store, retrieve, create, manipulate, organize, present, etc.) a set of IC layouts 100 using any solution. Environment 200 may also include, e.g., a manufacturing device 240 in the form of one or more currently known or later developed tools for fabrication of IC wafer(s) 130. While shown as a separate device, computing device 202 and fin cut isolation revision system 218 may be incorporated as part of a control system for a manufacturing device 240.

Computing device 202 can comprise one or more computing devices, including specific-purpose computing articles of manufacture (e.g., computing devices) capable of executing program code, such as fin cut isolation revisions system 218 installed thereon. As used herein, it is understood that "program code" means any collection of instructions, in any language, code or notation, that cause a computing device having an information processing capability to perform a particular function either directly or after any combination of the following: (a) conversion to another language, code or notation; (b) reproduction in a different material form; and/or (c) decompression. To this extent, fin cut isolation revision system 218 can be embodied as any combination of system software and/or application software.

Further, fin cut isolation revision system 218 can be implemented using a set of modules 220, e.g., a calculator, a comparator, a determinator, a layout reviser, etc. In this case, each module can enable computing device 202 to perform a set of tasks used by fin cut isolation revision system 218, and can be separately developed and/or implemented apart from other portions of fin cut isolation revision system 218. One or more modules can display (e.g., via graphics, text, sounds, and/or combinations thereof) a particular user interface on a display component such as a monitor. When fixed in memory 206 of computing device 202 that includes PU 204, each module can be module a substantial portion of a component that implements the functionality. Regardless, it is understood that two or more components, modules and/or systems may share some/all of their respective hardware and/or software. Further, it is understood that some of the functionality discussed herein may not be implemented or additional functionality may be included as part of computing device 202.

As noted herein, fin cut isolation revision system 218 may include or otherwise have access to various forms of IC layouts 100. IC layouts 100 may be included within memory 206 as shown in FIG. 4, and in addition or alternatively may be provided within storage system 212 and/or other components within environment 200 or communicatively connected thereto. IC layouts 100 can include digital images used by reticle forming system 250 to form reticle(s) 252 for use by manufacturing device 240 to form IC wafer 130.

When computing device 202 comprises multiple computing devices, each computing device may have only a portion of fin cut isolation revision system 218 (e.g., one or more modules) thereon. However, it is understood that computing device 202 and fin cut isolation revision system 218 are only representative of various possible equivalent computer systems that may perform a process described herein. To this extent, in other embodiments, the functionality provided by computing device 202 and fin cut isolation revision system 218 can be at least partially implemented by one or more computing devices that include any combination of general and/or specific purpose hardware with or without program code. In each embodiment, the hardware and program code, if included, can be created using standard engineering and programming techniques, respectively.

Regardless, when computing device 202 includes multiple computing devices, the computing devices can communicate over any type of communications link. Further, while performing a process described herein, computing device 202 can communicate with one or more other computer systems using any type of communications link. In either case, the communications link can comprise any combination of various types of wired and/or wireless links; comprise any combination of one or more types of networks; and/or use any combination of various types of transmission techniques and protocols.

Figure 7:
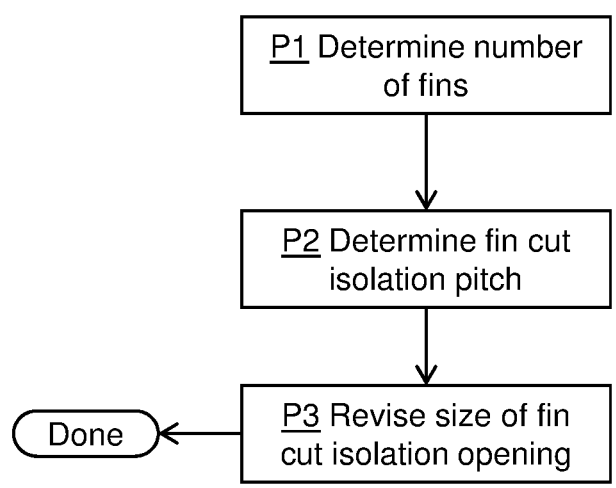
FIG. 7 provides an illustrative flow diagram of methods according to embodiments of the disclosure.

FIG. 7 shows a flow diagram which, in conjunction with FIGS. 4-6 and 8, will be used to describe embodiments of a method according to the disclosure. As noted, the method described herein is applied to a digital rendition of IC structure 108, referred to herein as an IC layout 100, for a reticle 252 (FIG. 6) to be used to form a fin cut isolation opening, i.e., in a fin. The process occurs prior to optical proximity correction, which is a common IC layout process that acts to compensate for layout shapes proximity to one another that would create a merger or non-formation of a shape. The processes described herein is only applied to areas for IC layout 100 including at least a portion of active region over a fin cut isolation region, e.g., see boxed areas in FIG. 8. That is, the process is only applied where overlay errors can cause failures in active regions of a transistor, and in which fin cut isolations 120 are employed.

In process P1, fin cut isolation revision system 218 determines a number of fins 112 to be cut with same source/drain connection by a fin cut isolation opening 122, e.g., in a fin cut isolation region (FIG. 4). In the FIG. 4 example, fin cut isolation 120A in FIG. 4 cuts two fins 112A, 112B with same source/drain connection (trench silicide), and fin cut isolation 120B cuts four fins 112A, 112B, 112C, 112D with same source/drain connection (trench silicide). The extent or shape of fin cut isolation region to which embodiments of the disclosure are applied can be user defined, e.g., where wire size changes exist, in a certain zone of the wafer, to certain transistor types, etc.

In process P2, fin cut isolation revision system 218 determines a fin cut isolation 110 pitch of the plurality of gates 110A-G in gate length direction. That is, the distance between successive fin cut isolations 120A-B is determined. Since the fin cut isolation pitch in the gate length direction can vary and is minimum gate pitch based, the determination is made to each side adjacent a fin cut isolation 120.

In process P3, fin cut isolation revision system 218 revises a size of fin cut isolation opening 122 in IC layout 100 based on a number of fins to be cut with same source/drain connection by the fin cut isolation opening and the fin cut isolation pitch in the gate length direction. In most cases, the revising includes reducing a width of fin cut isolation opening 122, i.e., at least near an upper surface thereof. That is, the revising includes moving at least one side of fin cut isolation opening 122 in IC layout 100 to reduce a width of the fin cut isolation opening 122. In one embodiment, for each selected side of the fin cut isolation opening in a respected fin, the revising includes: a) in response to the number of fins to be cut with same source/drain connection by the fin cut isolation opening being two and the fin cut isolation pitch in the gate length direction being greater than two gate pitch, moving the selected side of the fin cut isolation opening in the IC layout to reduce a width of the fin cut isolation opening by up to 0.5 nanometers; or b) in response to the number of fins to be cut with same source/drain connection by the fin cut isolation opening being two and the fin cut isolation pitch in the gate length direction being less than or equal to two gate pitch, moving the selected side of the fin cut isolation opening in the IC layout to reduce a width of the fin cut isolation opening by up to 1.0 nanometers. Alternatively to above or in addition thereto, for each selected side of the fin cut isolation opening in a respected fin, the revising includes: c) in response to the number of fins to be cut with same source/drain connection by the fin cut isolation opening being one and the fin cut isolation pitch in the gate length direction being greater than two gate pitch, moving the selected side of the fin cut isolation opening in the IC layout to reduce a width of the fin cut isolation opening by up to 1 nanometers; or d) in response to the number of fins to be cut with same source/drain connection by the fin cut isolation opening being one and the fin cut isolation pitch in the gate length direction being less than or equal to two gate pitch, moving the selected side of the fin cut isolation opening in the IC layout to reduce a width of the fin cut isolation opening by up to 1.5 nanometers. The revisions, i.e., moving of sides, is performed by fin cut isolation revisions system 218 on a respective IC layout 100 (digital), which is used to create a reticle 252 for manufacturing device 240.

To illustrate the changes, referring to FIG. 4, for each selected side of fin cut isolation opening 122 in a respected fin, e.g., 112A, the revising includes in response to the number of fins to be cut with same source/drain connection by fin cut isolation opening 122A being two and the fin cut isolation pitch in the gate length direction being greater than two (i.e., P>2) on the right side, moving the right side of fin cut isolation opening 122A in IC layout 100 to reduce a width of fin cut isolation opening 122A by up to 1 nanometers—see thinner area in fin cut isolation 120A over fins 112A, 112B. For example, fin cut isolation opening 122A in FIG. 4 crosses two fins 112A, 112B, and has a fin cut isolation pitch in the gate length direction being two gate pitch (2P) on the right side. For the left side of fin cut isolation opening 122A, the same treatment is applied (the left side adjacent fin cut isolation pitching being two gate pitch is not shown). Here, each side of fin cut isolation opening 122A is moved 1 nanometer to reduce a width of the fin cut isolation opening 120, i.e., over the fins. Similarly, fin cut isolation opening 122B in FIG. 4 crosses two fins 112A, 112B with the same source/drain connection, and has a fin cut isolation pitch in the gate length direction being two gate pitch (2P) on the left side. Here, the left side of fin cut opening 122B is moved 1 nanometer to reduce a width of fin cut isolation opening 122B, and the right side of 122B is moved 0.5 nanometers as the fin cut isolation pitch in gate length direction is greater than two gate pitch (2P) on the right side—see thinner area in fin cut isolation 120B over fins 112A, 112B.

As shown in FIG. 5, because fin cut isolation 120A is revised in size specifically to compensate the fin cut isolation etching profile variation and overlay shift sensitive fin cut isolation designs, a trench silicide (TS) contact 140 through various dielectric layers (not labeled) to a S/D region 114X can now be formed with improved process margin, e.g., with mask and etching, to land on S/D region 114X even if an overlay shift exists, even at a wafer edge region. Thus, the revision compensates for overlay inaccuracy which is especially induced by a combined overlay shift of multiple fin transistor forming layers (e.g., fin, fin cut, poly, and trench silicide layers, etc.). Any additional etching required for TS contact 140 to reach S/D region 114X can be provided without concern.

Figure 8:
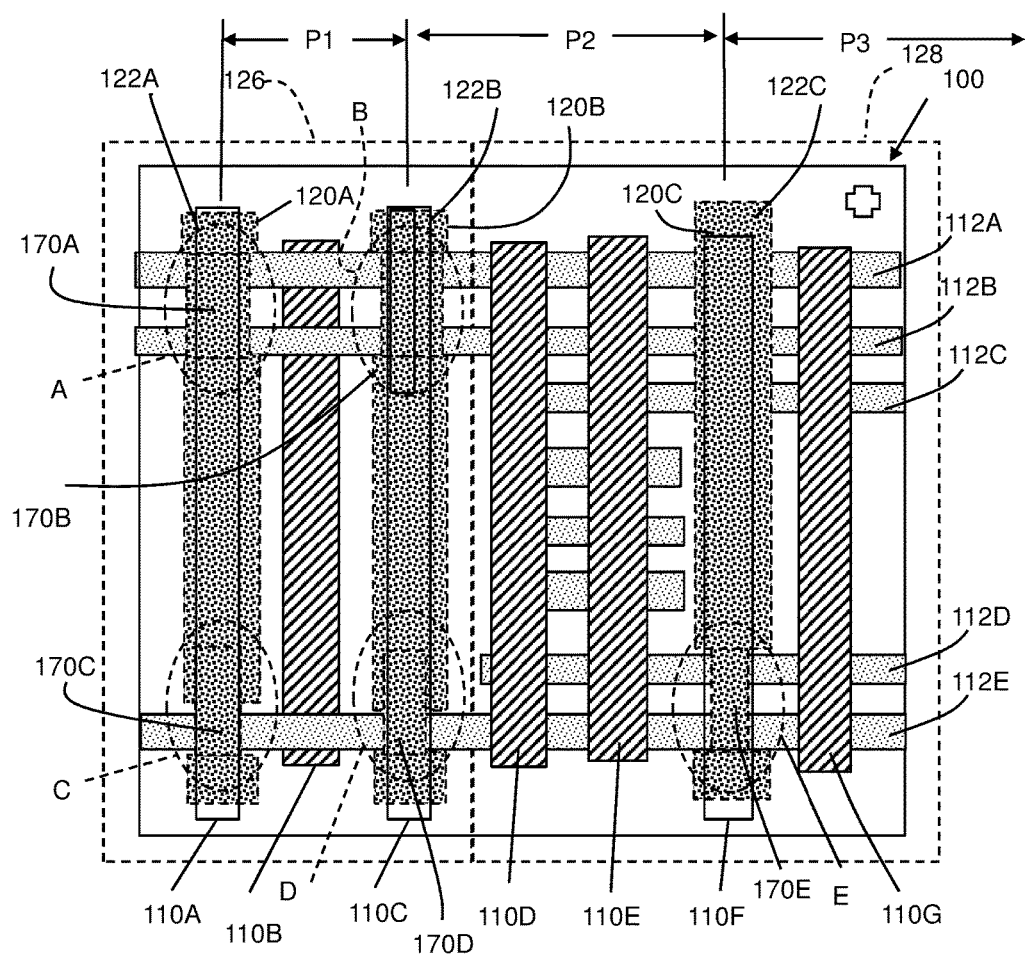
FIG. 8 shows a schematic plan view of another IC structure revised according to embodiments of the disclosure.

Referring to FIG. 8, another illustrative IC layout 100 is shown in schematic plan view. Here, again dummy gates 110 (110A, 110C, 110F) extending over fun cut isolations 120 are shown in phantom. In this example, fin cut isolation 120A pitch on the right side (for gates 110A-B) is two gate pitch (P1=2), and the pitch on the left side is not shown in the figure (assume it is greater than two). Similarly, fin cut isolation pitch in the gate length direction of fin cut isolation 120B on the left is three gate pitch (P2=3), and the pitch on the right side is not shown in the figure (assume it is greater than two). To illustrate the revisions made, areas A-E shown in dashed ovals will be described.

In area A, fin cut isolation opening 122A crosses two fins 112A, 112B, and has a fin cut isolation pitch in the gate length direction P1 being two on both sides (left side not shown). Here, each side of fin cut opening 122A is moved 1 nanometer to reduce a width of fin cut isolation opening 122A, creating a narrower section 170A where fin cut isolation 120A exists in fins 112A, 112B. Narrower section 170A is symmetrical relative to the rest of fin cut isolation 122A in area A.

In area B, the left side of fin cut isolation opening 122B crosses two fins 112A, 112B and has a fin cut isolation pitch in the gate length direction P1 being two. Here, the left side of fin cut isolation opening 122B in area D is moved 1 nanometer to reduce a width of the fin cut isolation opening, creating narrower section 170B where fin cut isolation 120B exists in fins 112A, 112B. However, the right side of fin cut isolation opening 122B crosses two fins 112A, 112B, and has a fin cut isolation pitch in the gate length direction P2 greater than two. Here, the right side of fin cut isolation opening 122B in area B is moved 1.0 nanometer to reduce a width of fin cut isolation opening 122B in narrower section 170B where fin cut isolation 120B exists in fins 112A, 112B. Consequently, it is possible for one side (right in example) of fin cut isolation opening 122B to be moved less than a second, opposing side (left in example) of fin cut isolation opening 122B to reduce the width of fin cut isolation opening 122B more on the one side than on the other, opposing side. The side that is closer to an area in which the fin cut isolation pitch in the gate length direction is greatest receives more width reduction. That is, the side that is closer to an adjacent fin cut isolation in which the fin cut isolation pitch in the gate length direction is smaller is reduced in width more. Narrower section 170B may be asymmetrical relative to the rest of fin cut isolation 122B in area B. In this manner, more reduction of width of fin cut isolation opening 122B in IC layout 100 is provided where necessary to compensate for overlay inaccuracy.

In another area C in FIG. 8, fin cut isolation opening 122A crosses one fin 112E, and has a fin cut isolation pitch in the gate length direction P1 being two on both sides (left side not shown). Here, each side of fin cut opening 122A is moved 1.5 nanometers to reduce a width of fin cut isolation opening 122A in narrower section 170C where it exists in fin 112E. Narrower section 170C is symmetrical relative to the rest of fin cut isolation 122A in area A.

In area D, fin cut isolation opening 122B crosses one fin 112E and has a fin cut isolation pitch in the gate length direction P1 of being two on the left side, but a fin cut isolation pitch in the gate length direction P2 on the right side greater than two. Here, the left side of fin cut opening 122B in area D is moved 1.5 nanometers to reduce a width of fin cut isolation opening 122B, but the right side of fin cut isolation opening 122B is moved 1.0 nanometer to reduce a width of fin cut isolation opening 122B. Narrower section 170D is asymmetrical relative to the rest of fin cut isolation 122B in area D. In this manner, again, more reduction of width of fin cut isolation opening 122D in IC layout 100 is provided where necessary to compensate for overlay inaccuracy.

In another example in FIG. 8, in an area E, the number of fins 112 to be cut by fin cut isolation opening 122C is two (112D, 112E) and fin cut isolation pitch in the gate length direction P2, P3 adjacent each side is greater than two (the right fin cut isolation of P3 not shown). Here, the revising by fin cut isolation system 218 may include moving each selected side of fin cut isolation opening 122C in IC layout 100 to reduce a width of fin cut isolation opening 122 by up to 0.5 nanometer. Narrower section 170E is symmetrical relative to the rest of fin cut isolation 122C in area E.

After fin cut isolation revision system 218 is complete with revisions any now known or later developed optical proximity correction (OPC) may performed on IC layout 100. Subsequently, the post OPC layouts go through reticle forming system 250 and the manufacturing process, the revised fin cut isolation will improve the finFET transistors source/drain and trench silicide connection performance with robust overlay shift margin. Further, the process improves the transistor electrical performance and wafer level production yield.

Returning to FIG. 5, embodiments of the disclosure may also include an IC structure 108 formed using IC layouts 100 revised according to methods of the disclosure. IC structure 108 may be made using any now known or later developed IC fabrication techniques, but may find advantage with gate last processes (i.e., replacement metal gate (RMG) processes). IC structure 108 may include a plurality of semiconductor fins 112 (four 112A-D shown) on a substrate 118. Fins 112A-D and a substrate 118 upon which they are supported may include but are not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entire semiconductor substrate may be strained.

IC structure 108 may also include a first fin-type field effect transistor (finFETs) 160B using at least one of the semiconductor fin 112A-D. IC structure 108 also includes a second finFET 160C on substrate 118 and adjacent first finFET 160B. Although not necessary, one of the finFETs, e.g., 160C, may use more semiconductor fins 112A-D than the other finFET 160B. In any event, they share at least one semiconductor fin, e.g., 112A-B. As understood, each finFET 160A-C includes a gate 110A, C, E-G extending over fins 112A-D creating a channel thereunder (not labeled), and source/drain regions 114 in the fins on opposing sides of gates 110A, C, E-G. Gates 110B, 110D extending over fin cut isolations 120A, 120B are in operative, and commonly referred to as dummy gates. A first fin cut isolation 120B segregates the at least one shared semiconductor fin 112A, 112B between first and second finFETs 160B and 160C, creating electrically isolated finFETs. First fin cut isolation 120B has a first width W1. A second fin cut isolation 120A segregates the at least one shared semiconductor fin 112A, 112B of first finFET 120B from at least one third finFET 120A, and second fin cut isolation 122A has a second width W2. In contrast to conventional IC structures 108, as a result of the fin cut isolation opening revisions provided, first and second widths W1 and W2 are within 1.0 nanometers of one another. In addition, each fin cut isolation 120 does not have a uniform width in a length thereof because they are narrower, i.e., have narrower sections 170, where they exist in respective fin(s) 112 compared to where they extend between fins 112. Although shown as the same width because they are so close in size, as noted herein, a first gate 110C of first finFET 160B may have a width (e.g., 16 nm) that is different (e.g., greater) than a width of second finFET 160C (e.g., 14 nm).

Embodiments of the disclosure compensate for overlay inaccuracies by revising fin cut isolation openings (i.e., (RC) mask) for fin cut isolations in an IC layout in only the active areas and before regular optical proximity correction (OPC). The amount of revision is customized to handle situations with less fins, where more compensation is necessary because the margin for error is less, and overlay errors are more significantly felt. As a result, the same overlay as would normally be used can be continued to be used. A resulting IC structure 108 exhibits more uniform local critical dimension of fin cut isolations 120, e.g., they are with 1.0 nanometer width where they intersect their respective fins, even though the fin cut isolation pitch in the gate length direction and fin number differ. As shown in the plan views of FIGS. 4 and 8, each fin cut isolation is narrower where the fin cut isolation intersects a respective fin compared to where the fin cut isolation extends between fins. Further, embodiments of the disclosure, prevents a small trench silicide contact etching margin from causing issues because there is not have enough gouging to connect to a S/D region. The revisions provided herein also benefits any subsequent retargeting through OPC by addressing problem areas prior to the OPC.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A method, comprising:
   for an integrated circuit (IC) layout including at least a portion of an active region including a plurality of gates extending over a plurality of fins, prior to optical proximity correction of the IC layout:
   determining a number of fins to be cut with same source/drain connection by a fin cut isolation opening;
   determining a fin cut isolation pitch in a gate length direction of the plurality of gates to each side of the fin cut isolation opening; and
   revising a size of the fin cut isolation opening in the IC layout based on the number of fins to be cut with same source/drain connection by the fin cut isolation opening and the fin cut isolation pitch in the gate length direction.

2. The method of claim 1, wherein for each selected side of the fin cut isolation opening in a respected fin, the revising includes:
   in response to the number of fins to be cut with same source/drain connection by the fin cut isolation opening being two and the fin cut isolation pitch in the gate length direction being greater than two, moving the selected side of the fin cut isolation opening in the IC layout to reduce a width of the fin cut isolation opening by up to 0.5 nanometers; or
   in response to the number of fins to be cut with same source/drain connection by the fin cut isolation opening being two and the fin cut isolation pitch in the gate length direction being less than or equal to two, moving the selected side of the fin cut isolation opening in the IC layout to reduce a width of the fin cut isolation opening by up to 1.0 nanometers.

3. The method of claim 1, wherein for each selected side of the fin cut isolation opening in a respected fin, the revising includes:
in response to the number of fins to be cut with same source/drain connection by the fin cut isolation opening being one and the fin cut isolation pitch in the gate length direction being greater than two, moving the selected side of the fin cut isolation opening in the IC layout to reduce a width of the fin cut isolation opening by up to 1.0 nanometers; or
in response to the number of fins to be cut with same source/drain connection by the fin cut isolation opening being one and the fin cut isolation pitch in the gate length direction adjacent the selected side being less than or equal to two, moving the selected side of the fin cut isolation opening in the IC layout to reduce a width of the fin cut isolation opening by up to 1.5 nanometers.

4. The method of claim 3, wherein for each selected side of the fin cut isolation opening in a respected fin, the revising includes:
in response to the number of fins to be cut with same source/drain connection by the fin cut isolation opening being two and the fin cut isolation pitch in the gate length direction adjacent the selected side being greater than two, moving the selected side of the fin cut isolation opening in the IC layout to reduce a width of the fin cut isolation opening by up to 0.5 nanometers; or
in response to the number of fins to be cut with same source/drain connection by the fin cut isolation opening being two and the fin cut isolation pitch in the gate length direction adjacent the selected side being less than or equal to two, moving the selected side of the fin cut isolation opening in the IC layout to reduce a width of the fin cut isolation opening by up to 1.0 nanometers.

5. The method of claim 1, wherein the revising includes moving at least one side of the fin cut isolation opening in the IC layout to reduce a width of the fin cut isolation opening.

6. The method of claim 5, wherein a first side of the fin cut isolation opening is moved more than a second, opposing side of the fin cut isolation opening to reduce the width of the fin cut isolation opening more on the first side than on the second, opposing side.

7. The method of claim 6, wherein the first side is closer to an adjacent fin cut isolation in which the fin cut isolation pitch in the gate length direction is smaller.

8. The method of claim 1, further comprising performing optical proximity correction on the IC layout for the active region in the reticle.

9. An integrated circuit (IC) structure, comprising:
a plurality of semiconductor fins on a substrate;
a first fin-type field effect transistor (finFETs) using at least one of the semiconductor fins;
a second fin-type field effect transistor (finFETs) on the substrate and adjacent the first finFET, the second finFET using more semiconductor fins than the first finFET but sharing at least one semiconductor fin with the first finFET;
a first fin cut isolation segregating the at least one shared semiconductor fin between the first and second finFET, the first fin cut isolation having a first width; and
a second fin cut isolation segregating the at least one shared semiconductor fin of the first finFET from at least one third finFET, the second fin cut isolation having a second width,
wherein the first and second width are within 1.0 nanometers of one another.

10. The IC structure of claim 9, wherein a first gate of the first finFET has a third width, and a second gate of the second finFET has a fourth width, wherein the third width is greater than the fourth width.

11. The IC structure of claim 9, wherein each fin cut isolation is narrower where the fin cut isolation intersects a respective fin compared to where the fin cut isolation extends between fins.

* * * * *